(12) United States Patent
Ohgami (10) Patent No.: US 8,797,778 B2
(45) Date of Patent: Aug. 5, 2014

(54) SEMICONDUCTOR MEMORY DEVICE HAVING OPEN BIT LINE STRUCTURE

(75) Inventor: Takeshi Ohgami, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 1099 days.

(21) Appl. No.: 12/646,579

(22) Filed: Dec. 23, 2009

(65) Prior Publication Data
US 2010/0165693 A1 Jul. 1, 2010

(30) Foreign Application Priority Data

Dec. 26, 2008 (JP) ................................. 2008-335000

(51) Int. Cl.
*G11C 5/06* (2006.01)
(52) U.S. Cl.
USPC .......................................................... 365/53
(58) Field of Classification Search
USPC .......................................................... 365/63
See application file for complete search history.

(56) References Cited

U.S. PATENT DOCUMENTS

| 5,373,463 | A | * | 12/1994 | Jones, Jr. ....................... 365/145 |
| 6,937,523 | B2 | * | 8/2005 | Eshel ........................ 365/185.28 |
| 2006/0291270 | A1 | * | 12/2006 | Koide ............................ 365/145 |
| 2007/0002601 | A1 | | 1/2007 | Hasunuma et al. |
| 2007/0104006 | A1 | * | 5/2007 | Hwang .......................... 365/210 |
| 2009/0116318 | A1 | | 5/2009 | Kuroda |

FOREIGN PATENT DOCUMENTS

JP 2007-005502 1/2007

* cited by examiner

*Primary Examiner* — Anthan Tran (57) ABSTRACT

A semiconductor memory device has an array structure of an open bit line structure and comprises a plurality of normal memory mats, two dummy mats and a plurality of rows of sense amplifiers. The normal memory mat includes a plurality of memory cells and arranged in a bit line extending direction, while the dummy mat includes a plurality of dummy cells and arranged in a bit line extending direction at both ends of the plurality of normal memory mats. The rows of sense amplifiers are arranged between the normal memory mats and between each of the normal memory mats and each of the dummy mats. A first predetermined number of the dummy cells, the number of which is smaller than a number of the memory cells arranged along each bit line of the normal memory mats, are arranged along each bit line of the dummy mats.

16 Claims, 7 Drawing Sheets

SEMICONDUCTOR MEMORY DEVICE HAVING OPEN BIT LINE STRUCTURE

BACKGROUND OF THE INVENTION

1. Field of the Invention

The present invention relates to a semiconductor memory device configured to read and write data stored in memory cells, and particularly relates to a semiconductor memory device employing an open bit line structure such as a DRAM (Dynamic Random Access Memory).

2. Description of Related Art

Conventionally, an open bit line structure and a folded bit line structure have been known as an array structure employed in a memory cell array divided into a plurality of memory mats in a DRAM. In the DRAM of the open bit line structure, a pair of bit lines connected to a sense amplifier is extended to memory mats different from each other. Meanwhile, in the DRAM of the folded bit line structure, a pair of bit lines connected to a sense amplifier is extended to the same memory mat. Generally, arrangement of memory cells of the folded bit line structure is restricted so that a cell size of each memory cell is supposed to be limited to $8F^2$ (F is a minimum processing dimension). On the contrary, memory cells of the open bit line structure can be arranged at all intersections of word lines and bit lines so that each memory cell can be formed with a cell size of $6F^2$. Thus, it is appropriate to employ the open bit line structure in order to improve integration of the DRAM. The DRAM of the open bit line structure is configured with a structure in which a plurality of normal memory mats are aligned in a bit line extending direction and end memory mats are arranged at both ends thereof. Each end memory mat has the same size as each normal memory mat, and due to its structure there are arranged dummy cells in a half area of the end memory mat. Thus, memory capacity of the end memory mat is half that of the normal memory mat and the end memory mat has the same size as the normal memory mat, thereby correspondingly decreasing area efficiency of the DRAM. Meanwhile, a technique to improve the area efficiency in the DRAM of the open bit line structure using a special configuration of end memory mats has been proposed (for example, refer to Patent Reference 1).

Patent Reference 1: Japanese Patent Application Laid-open No. 2007-5502

In the technique disclosed in the Patent Reference 1, the normal memory mats are formed with memory cells of $6F^2$ having the open bit line structure, and the end memory mats are formed with memory cells of $8F^2$ having the folded bit line structure, thereby improving the area efficiency without using dummy cells. However, when employing the technique disclosed in the Patent Reference 1, memory cells whose cell size is $6F^2$ and memory cells whose cell size is $8F^2$ are mixed, and there arises a problem that process technique of the DRAM becomes complex because of a difference of memory cell structures. Further, in consideration of the difference between memory cell structures of the end memory mat and the normal memory mat, the area of the end memory mats is merely about two-thirds of the area of the normal memory mats even if the dummy cells are not required, which is a problem of difficulty in remarkably improving the area efficiency.

SUMMARY

The present invention seeks to solve the above problems and provides a semiconductor memory device employing an open bit line structure, in which memory cell structure of end memory mats is common to that of normal memory mats and an area of the end memory mats is reduced so that area efficiency can be remarkably improved.

In one of aspects of the invention, there is provided a semiconductor memory device having an array structure of an open bit line structure comprising: a plurality of normal memory mats each including a plurality of memory cells, the normal memory mats aligned at least in a bit line extending direction; two dummy mats each including a plurality of dummy cells, the dummy mats arranged in a bit line extending direction at both ends of the plurality of normal memory mats; and a plurality of rows of sense amplifiers arranged between the normal memory mats and between each of the normal memory mats and each of the dummy mats. In the semiconductor device, a first predetermined number of the dummy cells, the number of which is smaller than a number of the memory cells arranged along each bit line of the normal memory mats, are arranged along each bit line of the dummy mats.

According to the aspects of the invention, in the memory cell array employing the open bit line structure, dummy mats are arranged at both ends of normal memory mats and the plurality of dummy cells are arranged in each dummy mat. Therefore, by arranging the first predetermined number of the dummy cells along each bit line forming a complimentary pair with a bit line of the normal memory mat, the first predetermined number can be remarkably smaller than the number of memory cells arranged in the normal memory mat, thereby sufficiently reducing the size of end memory mats.

As described above, according to the present invention, when employing the open bit line structure in the semiconductor memory device, end memory mats at both ends of the normal memory mats are used as dummy mats so that a plurality of dummy cells are arranged therein. Therefore, the dummy mats can be decreased in size without requiring a large size of a conventional end memory mat so as to improve area efficiency. Further, since the structure of the dummy mat can be commonly used for the normal memory mat, a simple array structure can be achieved without using a complex process technology. Furthermore, each bit line of the dummy mat can have substantially the same resistance and capacitance values as those of each bit line of the normal memory mat, and thus a reliable sensing operation can be maintained in an adjacent row of sense amplifiers.

BRIEF DESCRIPTION OF THE DRAWINGS

The above featured and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes. In the following, an embodiment in which the present invention is applied to a DRAM as a semiconductor memory device will be described.

Figure 1:
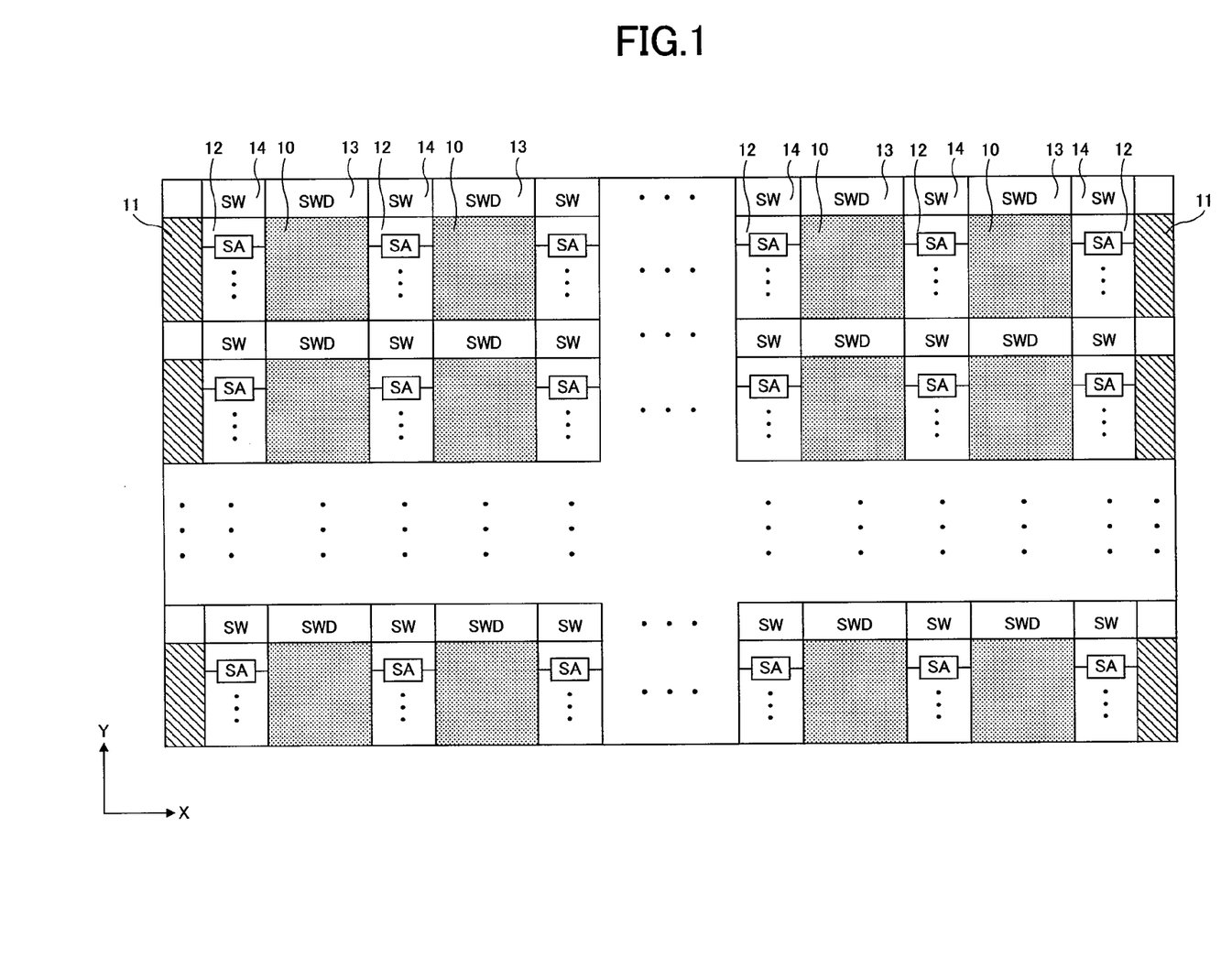
FIG. 1 is a block diagram schematically showing a configuration of a memory cell array and its peripheral part in a DRAM of an embodiment.
Figure 2:
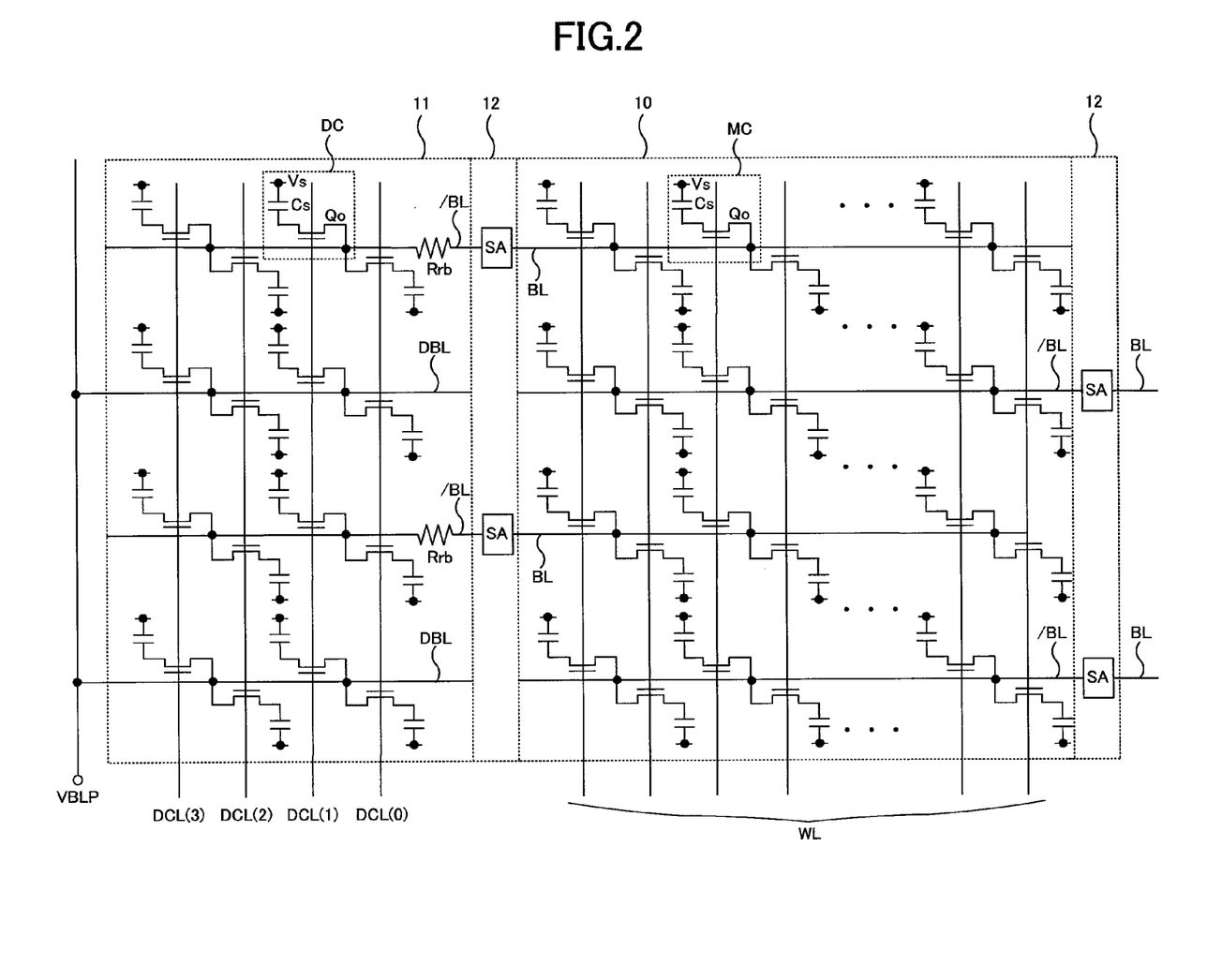
FIG. 2 is a specific configuration of a part of the memory cell array of FIG. 1.

A configuration of a memory cell array in the DRAM of the embodiment will be described with reference to FIGS. 1 and 2. FIG. 1 is a block diagram schematically showing the memory cell array and its peripheral part, and FIG. 2 is a diagram showing a specific configuration of a part of the memory cell array of FIG. 1. The DRAM of the embodiment employs an open bit line structure as an array structure of the memory cell array. An entire area of the memory cell array is divided into portions (for example, 16 portions) in a bit line extending direction (X direction shown in FIG. 1) and divided into portions (for example, 16 portions) in a word line extending direction (Y direction shown in FIG. 1). Then, dummy mats 11 serving as end memory mats are arranged at both ends of each group including a plurality of normal memory mats 10 aligned in the X direction. For example, the entire area of the memory cell array is configured by arranging 16×16 normal memory mats 10 and 2×16 dummy mats 11. In addition, the present invention can be applied to another array structure in which the memory cell array is divided into portions only in the X direction and is not divided into portions in the Y direction.

FIG. 2 shows specific configurations of one normal memory mat 10 at the left end and adjacent one dummy mat 11. In the normal memory mat 10, a plurality of (M) bit lines BL extending in the X direction and a plurality of (N) word lines WL extending in the Y direction are arranged, and a plurality of memory cells MC are formed at intersections thereof. For example, the normal memory mat 10 can be formed with 256×512 memory cells MC by arranging 256 word lines WL and 512 bit lines BL. Each memory cell MC is composed of a transistor Q0 and a capacitor Cs and has a cell size of $6F^2$. The transistor Q0 has a gate connected to a word line WL, a source connected to a bit line BL, and a drain connected to one terminal of the capacitor Cs. Further, the other terminal of the capacitor Cs is connected to a predetermined potential Vs.

Meanwhile, in the dummy mat 11, M/2 bit lines /BL and M/2 dummy bit lines DBL respectively extending in the X direction are alternately arranged, and a predetermined number (the first predetermined number of the invention) of dummy cell control lines DCL are arranged. A plurality of dummy cells DC are formed at intersections of the bit lines /BL, the dummy bit lines DBL and the dummy cell control lines DCL. In FIG. 2, four dummy cell control lines DCL(0) to DCL(3) are exemplified. In this case, the dummy mat 11 can be formed with, for example, 4×512 dummy cells DC by alternately arranging 256 bit lines /BL and 256 dummy bit lines DBL and arranging four dummy cell control lines DCL(0) to DCL(3).

Each dummy cell DC, which is composed of a transistor Q0 and a capacitor Cs, has the same size and structure as the above-mentioned memory cell MC and has the cell size of $6F^2$. The transistor Q0 of the dummy cell DC has a gate connected to the dummy cell control line DCL, a source connected to the bit line /BL or the dummy bit line DBL, and a drain connected to one terminal of the capacitor Cs. The other terminal of the capacitor Cs is connected to the predetermined potential Vs.

The number of dummy cells DC arranged along one bit line /BL or one dummy bit line DBL is in principal set within a range where a sum of capacitance values of the capacitors Cs (hereinafter refer to as "cell capacitance Cs") thereof can be controlled to be approximately the same as that of a bit line capacitance Cb in the normal memory mat 10. For example, when the bit line capacitance Cb is 50 fF and the cell capacitance Cs of each dummy cell DC is 25 fF, two dummy cells DC may be arranged along each bit line /BL or each dummy bit line DBL. However, it is possible to arrange a larger number of dummy cells DC on the premise of controlling ON/OFF of the dummy cells DC in response to the dummy cell control lines DCL as described later.

Returning to FIG. 1, a row of sense amplifiers 12 is arranged between two adjacent normal memory mats 10. Similarly, the row of sense amplifiers 12 is also arranged between the normal memory mat 10 and the dummy mat 11. Each row of sense amplifiers 12 includes a plurality of sense amplifiers SA aligned in the Y direction. The sense amplifier SA is connected to one bit line BL and one bit line /BL (hereinafter refer to as "a pair of bit lines BL and /BL") which form a complementary pair, and amplifies a voltage difference between both lines. In the row of sense amplifiers 12, there are arranged N/2 sense amplifiers SA each connected to the pair of bit lines BL and /BL.

As shown in FIG. 2, in the normal memory mat 10 adjacent to the dummy mat 11 at the left end, the bit lines BL are connected to the sense amplifiers SA of the row of sense amplifiers 12 on the left side, the bit lines /BL are connected to the sense amplifiers SA of the row of sense amplifiers 12 on the right side, and they are arranged alternately. Further, in the dummy mat 11, the bit lines /BL are connected to the sense amplifiers SA of the row of sense amplifiers 12 on the right side, and the dummy bit lines DBL are connected to a line of a precharge potential VBLP. The arrangement of the dummy bit lines DBL corresponds to a portion where no sense amplifiers SA is arranged in the row of sense amplifiers 12.

Further, a resistance element Rrb is connected in series between each bit line /BL and each sense amplifier SA in the dummy mat 11. The resistance element Rrb is formed, for example, using a diffusive resistance, and resistance values of the bit line /BL and the resistance element Rrb are set to be equal to a value of a bit line resistance Rb in the normal memory mat 10.

By employing the configuration of the embodiment, the capacitance value and the resistance value of one bit line BL can be substantially the same as those of the other bit line /BL when the sense amplifier SA of the row of sense amplifiers 12 is operating. In practice, the number of dummy cells DC arranged in the dummy mat 11 can be remarkably smaller than the number of memory cells MC arranged in the normal memory mat 10, and thereby the area of the dummy mats 11 can be drastically reduced. For example, in the configuration of FIG. 1, N word lines WL are arranged in the normal memory mat 10 while four dummy cell control lines DCL are required in the dummy mat 11, so that a sufficient effect of reducing the area can be obtained particularly when N is large. Further, since the structure of the dummy mats 11 is common to that of the normal memory mats 10, there is a merit that applying a complicated process technique can be avoided.

Returning to FIG. 1, sub-word drivers (SWD) 13 are arranged on both sides of each normal memory cell 10 in the Y direction. Each sub-word driver 13 selectively connects each sub-word line (word line WL) in the normal memory mat 10 to a common main word line (not shown) extending in the Y direction. Switch circuits (SW) 14 are arranged on both sides of each row of sense amplifiers 12 in the Y direction. Each switch circuit 14 selectively connects a signal transmitted via the row of sense amplifiers 12 to input/output lines.

Figure 3:
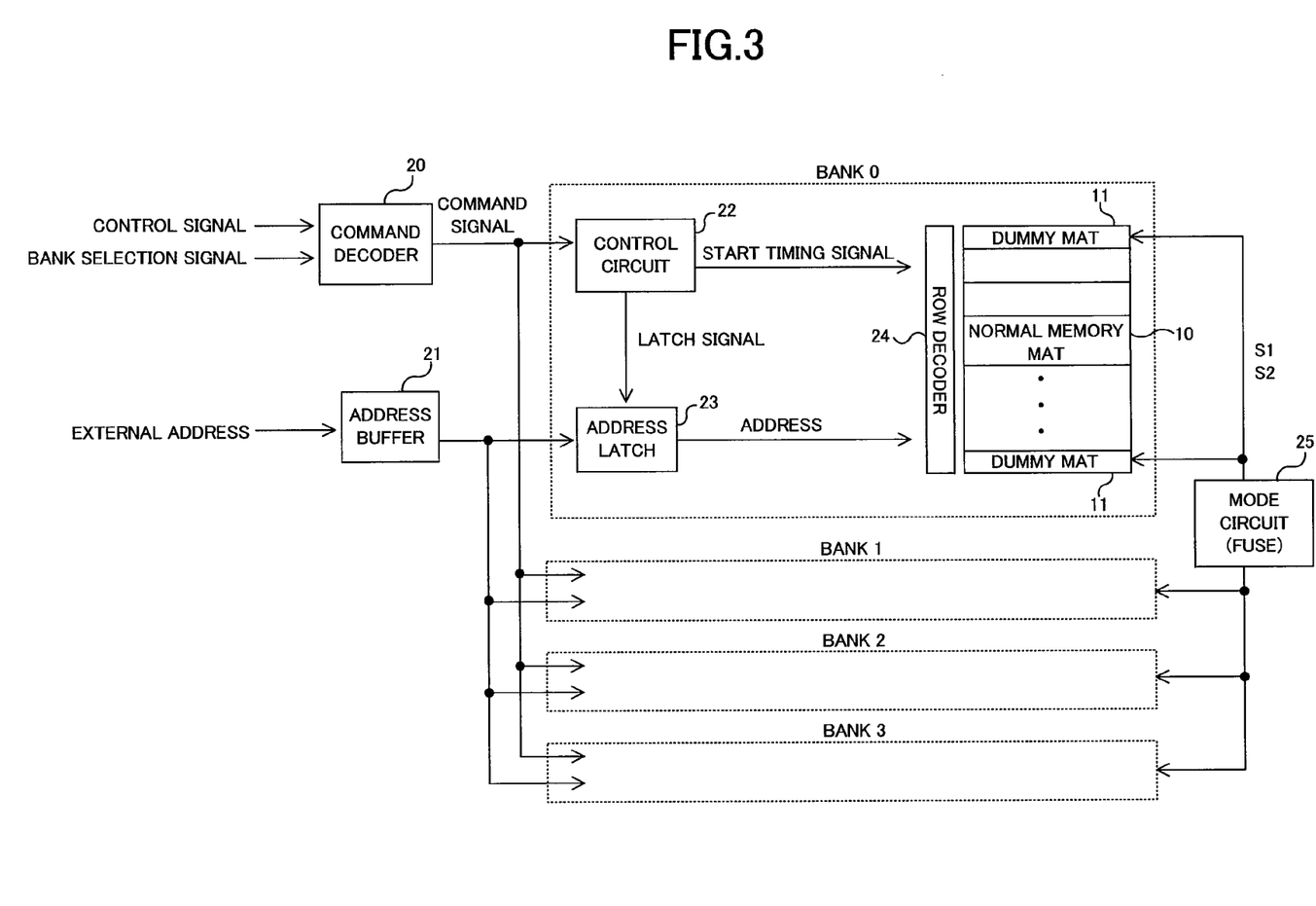
FIG. 3 is a schematic circuit block diagram of the DRAM of the embodiment.

Next, control and operation of the memory cell array in the DRAM of the embodiment will be described with reference to FIGS. 3 to 6. FIG. 3 shows an example of a schematic circuit block diagram of the DRAM of the embodiment. The DRAM shown in FIG. 3 includes four banks (0 to 3) having the same size and function. The memory cell array shown in FIG. 1 is formed in each bank. Although the circuit block diagram of FIG. 3 is simplified, the memory cell array in each bank includes a plurality of normal memory mats 10 aligned in the bit line extending direction and dummy mats 11 at both ends thereof. Further, a row decoder 24 selecting a predetermined word line is provided attached to the memory cell array.

As shown in FIG. 3, there are provided a command decoder 20, an address buffer 21 and a mode circuit 25, which are common to the four banks. The command decoder 20 generates a command signal in response to a control signal and a bank selection signal which are inputted from outside, and supplies the command signal to a bank to be accessed. The address buffer 21 buffers an externally inputted address, and sends the address to each bank. The mode circuit 25 supplies a dummy cell selection signal S1 and an operation selection signal S2 to the dummy mats 11 of each bank. The mode circuit 25 may be replaced with a fuse circuit having the same function. In addition, operation control of the dummy mats 11 based on the dummy cell selection signal 51 and the operation selection signal S2 will be described later.

Each bank further includes a control circuit 22 and an address latch 23. The control circuit 22 controls the operation of the bank in response to the command signal, and supplies various control signals such as start timing signals for the word line WL and the sense amplifier SA to various parts in the bank. The address latch 23 supplies the address from the address buffer 21 to the row decoder 24 and the memory cell array in response to a latch signal received from the control circuit 22.

Figure 4:
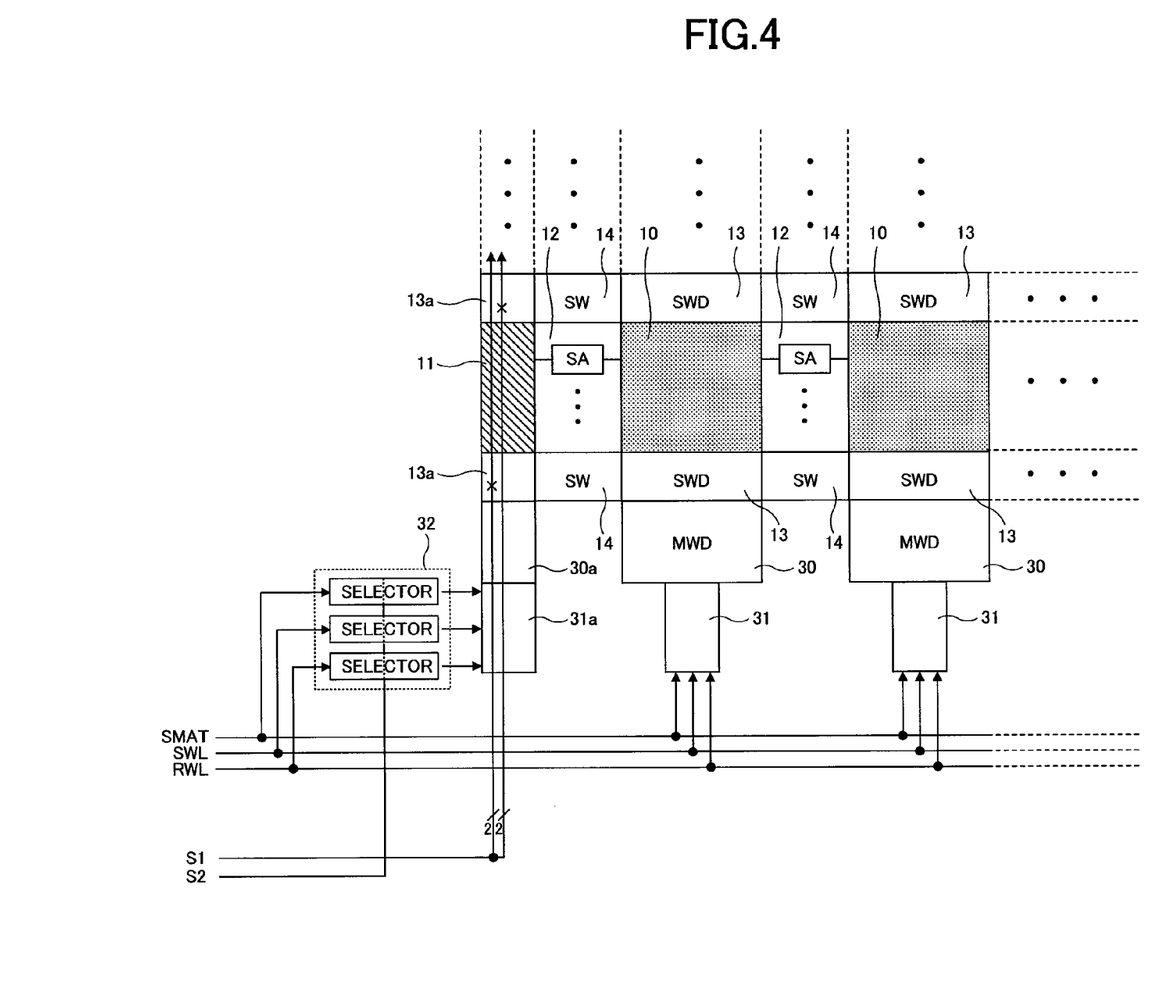
FIG. 4 is a partially enlarged block diagram showing the memory cell array and its peripheral part in an arbitrary bank of the DRAM of the embodiment.

FIG. 4 is a partially enlarged block diagram showing the memory cell array and its peripheral part in an arbitrary bank for the purpose of explaining the control of each dummy mat 11 of FIG. 3. In FIG. 4, the normal memory mats 10, the dummy mat 11, the rows of sense amplifiers 12, the sub-word drivers 13 and the switch circuits 14 are the same as those in the configuration of FIG. 1, so description thereof will be omitted. Meanwhile, in FIG. 4, there are provided main word drivers 30 for driving the main word lines 30 and main word controllers 31 for controlling the operation of the main word drivers 30, which are respectively attached to a plurality of memory mats 10 aligned in the Y direction. Similarly, there are provided a main dummy cell control line driver 30a for driving the main dummy cell control lines, a main dummy cell control line controller 31a for controlling the operation of the main dummy cell control line driver 30a, and a selector unit 32 for selecting the operation of the main dummy cell control line controller 31a, which are respectively attached to a plurality of dummy mats 11 aligned in the Y direction. There are further provided a sub dummy cell control line driver 13a for selectively controlling the dummy cell control lines DCL of each of dummy mats 11 having a common main dummy cell control line.

As shown in FIG. 4, a mat selection signal SMAT, a word line set signal SWL and a word line reset signal RWL respectively supplied by the control circuit 22 are sent to the main word controller 31 attached to the normal memory mat 10 and are sent to the selector unit 32 attached to the dummy mat 11. A dummy cell selection signal S1 is also supplied from the mode circuit 25 to the dummy cell control line controller 31a attached to the dummy mat 11. As shown in FIG. 2, when the four dummy cell control lines DCL are provided, the dummy cell selection signal 51 of 2 bits needs to be used. Meanwhile, the selector unit 32 includes selectors which receive the mat selection signal SMAT, the word line set signal SWL and the word line reset signal RWL respectively, and each selector is controlled in response to the operation selection signal S2 supplied from the mode circuit 25 (or the fuse circuit).

In the configuration of FIG. 4, circuit configurations of the sub dummy cell control line driver 13a, the main dummy cell control line driver 30a and the main dummy cell control line controller 31a, which are attached to the dummy mat 11, are common to those of the sub-word driver 13, the main word driver 30 and the main word controller 31, which are attached to the normal memory mat 10. Thus, it is advantageous that the control of the dummy mat 11 can be shared with the control of the normal memory mat 10.

Figure 5:
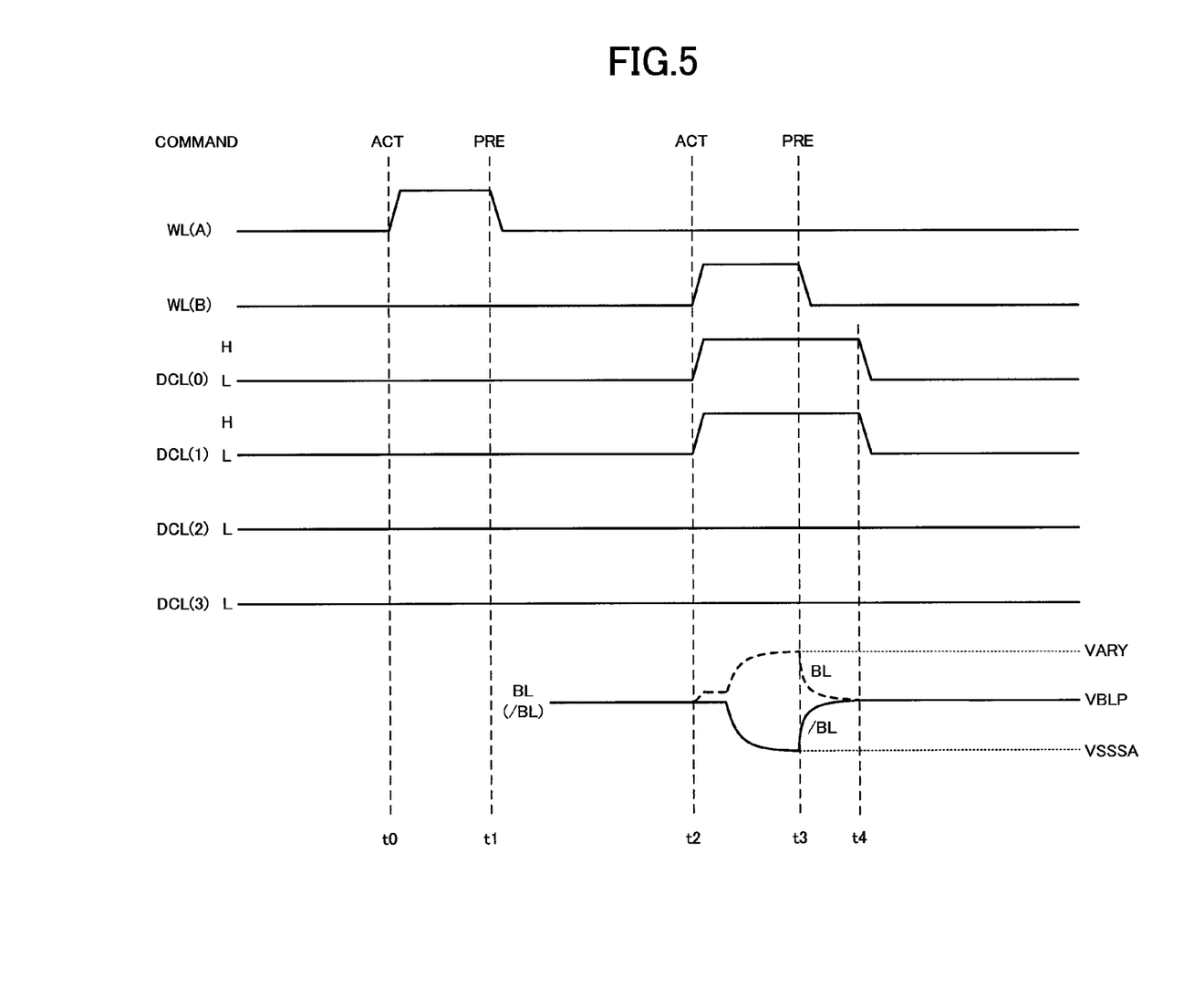
FIG. 5 is a first operation waveform diagram explaining control of a dummy mat 11.

FIG. 5 is a first operation waveform diagram explaining the control of the dummy mat 11. The first operation waveform diagram includes waveforms of a selected word line WL(A) of a normal memory mat 10(A) which is not adjacent to the dummy mat 11, a selected word line WL(B) of a normal memory mat 10(B) adjacent to the dummy mat 11, four dummy cell control lines DCL(0) to DCL(3) of the dummy mat 11, and one pair of bit lines BL and /BL read out to the sense amplifier SA. In addition, an initial voltage of each dummy cell DC of the dummy mat 11 is assumed to be set to the precharge potential VBLP in an initial state.

At a timing t0, the normal memory mat 10(A) is selected by an ACT command. Thereby, the selected word line WL(A) is driven, and is reset by a PRE command at a timing t1 after a predetermined period is elapsed. At this point, each of the dummy cell control lines DCL(0) to DCL(3) is maintained at a low level. On the other hand, when the normal memory mat 10(B) is selected by the ACT command at a timing t2 so that the selected word line WL(B) is driven, two (the second predetermined number of the invention) dummy cell control lines DCL(0) and DCL(1) are simultaneously activated to a high level. Since the bit line capacitance Cb of the normal memory mat 10 is assumed to be 50 fF and the cell capacitance Cs of the dummy cell DC is assumed to be 25 fF, two dummy cells DC connected to the bit line /BL are turned ON by two dummy cell control lines DCL(0) and DCL(1), and therefore the pair of bit lines BL and /BL inputted to the sense amplifier SA become to have the same capacitance value.

As shown in FIG. 5, after the timing t2, a minute potential of the memory cell MC of the normal memory mat 10 is read out to the bit line BL, and subsequently amplified by the sense amplifier SA. At this point, the level of the bit line BL gradually increases to a voltage VARY, and the level of the bit line /BL which forms the complementary pair with the bit line BL gradually decreases to a voltage VSSSA. Then, when the selected word line WL is reset by the PRE command at a timing t3, the pair of bit lines BL and /BL returns to the precharge potential VBLP again. Since the pair of bit lines BL and /BL have substantially the same resistance value and the same capacitance value, operation waveforms thereof symmetrically change with polarities reverse to each other. Thereafter, the dummy cell control lines DCL(0) and DCL(1) are reset at the low level at a timing t4. In addition, a delay time between timings t3 and t4 is set to a time required for stabilizing the pair of bit lines BL and /BL to the precharge potential VBLP.

Figure 6:
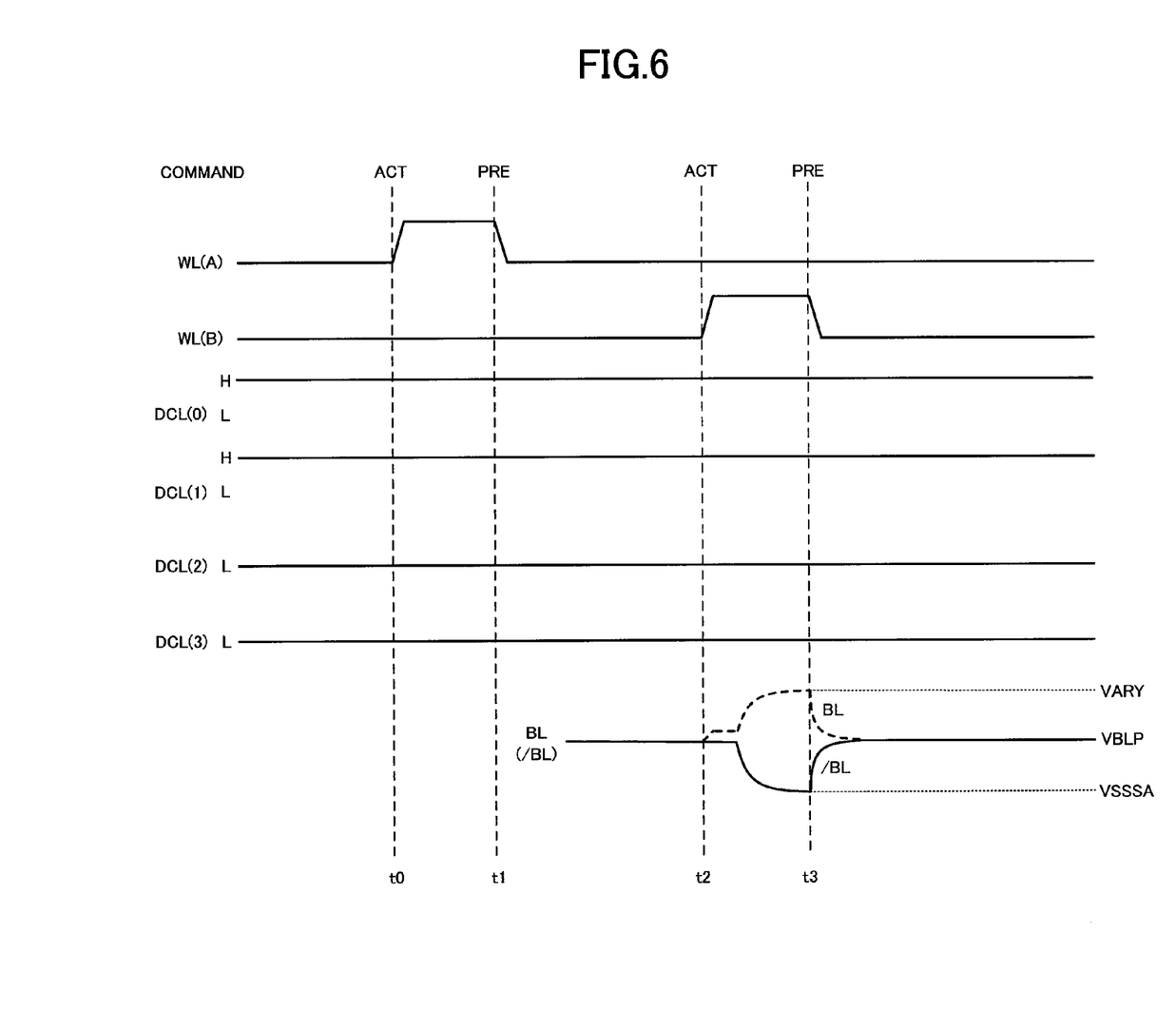
FIG. 6 is a second operation waveform diagram explaining the control of the dummy mat 11.

Next, FIG. 6 shows a second operation waveform diagram explaining the control of the dummy mat 11. The second operation waveform diagram includes waveforms common to those of the first operation waveform diagram of FIG. 5, however four dummy cell control lines DCL(0) to DCL(3) are controlled in a different manner. That is, the dummy cell control lines DCL(0) and DCL(1) are continuously maintained at a high level from an initial point. Thus, two dummy cells DC connected to the bit line /BL by the dummy cell control lines DCL(0) and DCL(1) are always ON. Therefore, since the time between timings t3 and t4 in FIG. 5 is not required, high-speed operation can be correspondingly expected. The control in FIG. 6 allows the dummy cell control lines DCL to be controlled simply. In FIG. 6, other operation waveforms are the same as those in FIG. 5, so description thereof will be omitted.

Figure 7:
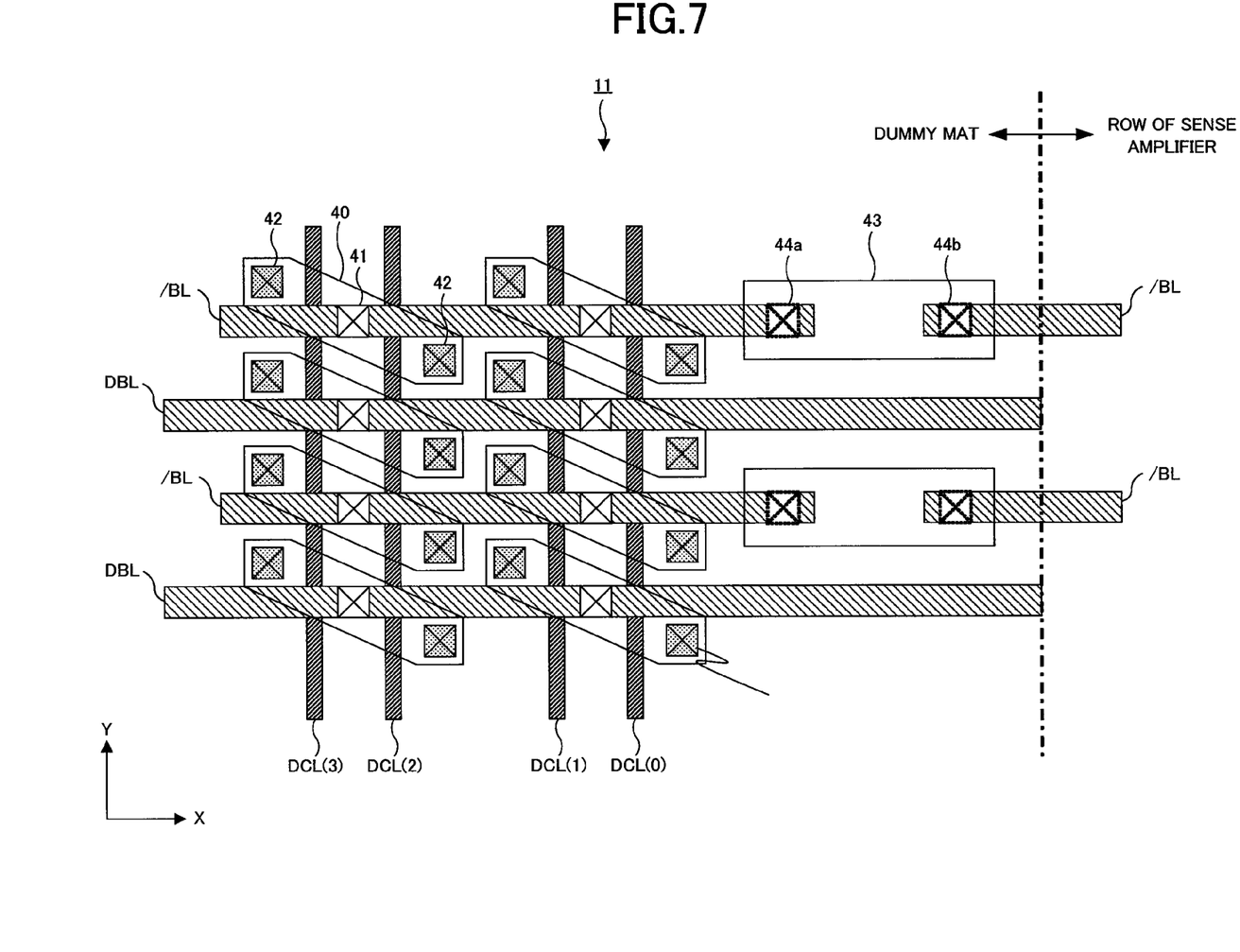
FIG. 7 is a diagram showing an example of a partial layout of an area including the dummy mat 11 in the memory cell array.

Next, a layout of the memory cell array of the DRAM of the embodiment will be described. FIG. 7 shows an example of a partial layout of an area including the dummy mat 11 in the memory cell array. The layout shown in FIG. 7 includes the area where two bit lines /BL and two dummy bit lines DBL extending in the X direction intersect with four dummy cell control lines DCL extending in the Y direction. The bit lines /BL and the dummy bit lines DBL are arranged in parallel with the same pitch in an upper wiring layer. A plurality of diffusion layers 40 are formed in a lower layer in FIG. 7, and each of the diffusion layers 40 corresponds to two dummy cells DC. Each of the two dummy cell control lines DCL intersecting with the diffusion layers 40 functions as gate electrodes, which partitions a central source region located between two gate electrodes and two drain regions on both sides of the source regions.

In each diffusion layer 40, a first contact 41 is formed on the source region, and second contacts 42 are formed on the two drain regions. The first contact 41 consists of a lower cell contact and an upper bit line contact, and each of the second contacts 42 consists of a lower cell contact and an upper capacitance contact. The source region and the upper bit line /BL or the upper dummy bit line DBL are connected via the first contact 41, and the drain regions and upper electrodes of the capacitors Cs are connected via the second contact 42.

A diffusive resistance 43 functioning as the above-mentioned resistance element Rrb is formed at one end of each bit line /BL. Third contacts 44a and 44b are formed on both ends of the diffusive resistance 43. The both ends of the diffusive resistance 43 and the upper bit line /BL are connected via the third contacts 44a and 44b, and a path from the bit line /BL to the bit line /BL at the side of the sense amplifier SA is formed through the third contact 44a, the diffusive resistance 43 and the third contact 44b. Thereby, the diffusive resistance 43 as the resistance element Rrb is connected in series in the bit line /BL of the dummy mat 11. In addition, the structure of the resistance element Rrb is not limited to the diffusive resistance 43 and may be formed in other structures.

In the embodiment, the layout of the dummy mat 11 shown in FIG. 7 can be commonly used for the layout of the normal memory mat 10. That is, in the normal memory mat 10, the word lines WL are arranged in the same manner as the dummy cell control lines DCL in FIG. 7, and the diffusion layers corresponding to the memory cells MC have the same structure as that of the diffusion layers 40 of FIG. 7. Accordingly, the dummy mats 11 can be formed without a complicated manufacturing process, and it is possible to minimize load in manufacturing process.

In the foregoing, the present invention has been specifically described based on the embodiment, however the present invention is not limited to the above embodiment, and various modifications can be applied to the present invention without departing from the scope of the present invention. That is, the present invention can be applied to semiconductor memory devices capable of achieving the same function with various structures.

The invention claimed is:

1. A semiconductor device comprising:
   a plurality of sense amplifiers each including first and second sense nodes;
   a plurality of first lines each connected to the first sense node of an associated one of the sense amplifiers;
   a plurality of second lines;
   a plurality of resistive elements each connected in series between an associated one of the second lines and the second sense node of an associated one of the sense amplifiers;
   a plurality of third lines intersecting the first lines;
   a plurality of first memory cells each disposed at an associated one of intersections of the first lines and the third lines;
   at least one fourth line intersecting the second lines; and
   a plurality of second memory cells each disposed at an associated one of intersections of the second lines and the fourth line.

2. The device as claimed in claim 1, wherein the at least one fourth line is smaller in number than the third lines so that the second memory cells are smaller in number of the first memory cells.

3. The device as claimed in claim 2, wherein the sense amplifiers are arranged in line in a first direction and each of the first and second lines is elongated in a second direction crossing the first direction.

4. The device a claimed in claim 1, further comprising a plurality of fifth lines which are mixed with the second lines and supplied with a predetermined potential.

5. A semiconductor device comprising:
   a plurality of memory arrays arranged in line in a first direction, the memory arrays thereby including a first end memory array, a second end memory array and at least one intermediate memory array between the first and second end memory arrays; and
   a plurality of sense amplifier sets, each of the sense amplifier sets being between associated adjacent ones of the memory arrays and including a plurality of sense amplifiers arranged in line in a second direction crossing the first direction;
   the at least one intermediate memory array including:
   a plurality of first bit lines each extending in the first direction and belonging to one of the sense amplifier sets,
   a plurality of second bit lines each extending in the first direction and belonging to a different one of the sense amplifier sets,
   a plurality of first word lines each extending in the second direction to cross the first and second bit lines, and
   a plurality of first memory cells each disposed at an associated one of crossing points of the first word lines and the first and second bit lines;
   each of the first and second end memory arrays including:
   a plurality of third bit lines each extending in the first direction and belonging to one of the sense amplifier sets, a plurality of fourth bit lines each extending in the first direction and connected to no one of the sense amplifier sets, a plurality of second word lines each extending in the second direction to cross the third and fourth bit lines, the second word lines being smaller in number than the first word lines, and a plurality of second memory cells each disposed at an associated one of crossing points of the second word lines and the third and fourth bit lines, the second memory cells being smaller in number than the first memory cells of the at least one of the intermediate memory array.

6. The device as claimed in claim 5, wherein each of the first and second end memory arrays further includes a plurality of resistive elements each connected between an associated one of the third bit lines and an associated one of the sense amplifiers of the one of the sense amplifier sets.

7. The device as claimed in claim 5, wherein one of the first word lines of the at least one intermediate memory array is activated with activating at least two of the second word lines of one of the first and second end memory arrays.

8. The device as claimed in claim 7, wherein each of the first and second end memory arrays further includes a plurality of resistive elements each connected between an associated one of the third bit lines and an associated one of the sense amplifiers of the one of the sense amplifier sets.

9. The device as claimed in claim 5,
wherein the sense amplifier set, to which the first bit lines of the at least one intermediate memory cell array belong, is in common to the sense amplifier set, to which the third bit lines of one of the first and second end memory cell arrays belong; and
wherein at least one of the second word lines of the one of the first end memory cell arrays is configured to be activated at least when one of the first word lines of the at least one intermediate memory array is activated.

10. The device as claimed in claim 5,
wherein the sense amplifier set, to which the first bit lines of the at least one intermediate memory cell array belong, is in common to the sense amplifier set, to which the third bit lines of one of the first and second end memory cell arrays belong; and
wherein at least two of the second word lines of the one of the first end memory cell array are configured to be activated at least when one of the first word lines of the at least one intermediate memory array is activated.

11. A semiconductor device comprising:
a plurality of memory arrays arranged in line in a first direction, the memory arrays thereby including a first end memory array, a second end memory array and at least one intermediate memory array between the first and second end memory arrays;
a plurality of first sense amplifiers disposed between the first end memory array and the at least one intermediate memory array and arranged in line in a second direction crossing the first direction, each of the first sense amplifiers including first and second sense nodes and amplifying, when activated, a potential between the first and second sense nodes; and
a plurality of second sense amplifiers disposed between the second end memory array and an intermediate memory array of the at least one intermediate memory array and arranged in line in the second direction, each of the second sense amplifiers including third and fourth sense nodes and amplifying, when activated, a potential between the third and fourth sense nodes;

the first end memory array including:
a plurality of first bit lines each extending in the first direction and each operatively connected to the first sense node of an associated one of the first sense amplifiers,
a plurality of second bit lines each extending in the first direction and connected to no one of the first sense amplifiers, and
a plurality of first memory cell sets, each of the first memory cell sets including a plurality of memory cells and being connected to an associated one of the first bit lines;
the at least one intermediate memory array including:
a plurality of third bit lines each extending in the first direction and each operatively connected to the second sense node of an associated one of the first sense amplifiers, each of the third bit lines being larger in length than each of the first bit lines, and
a plurality of second memory cell sets, each of the second memory cell sets including a plurality of memory cells and being connected to an associated one of the third bit lines, each of the second memory cell sets being larger in number of memory cells than each of the first memory cell sets; and
the second end memory array including:
a plurality of fourth bit lines each extending in the first direction and each operatively connected to the third sense node of an associated one of the second sense amplifiers,
a plurality of fifth bit lines each extending in the first direction and connected to no one of the second sense amplifiers, and
a plurality of third memory cell sets, each of the third memory cell sets including a plurality of memory cells and being connected to an associated one of the fourth bit lines.

12. The device as claimed in claim 11, wherein the memory arrays further includes a second intermediate memory array between the first intermediate memory array and the second sense amplifiers, and the second intermediate memory array includes:
a plurality of fourth bit lines each extending in the first direction and each operatively connected to the fourth sense node of an associated one of the second sense amplifiers, each of the fourth bit lines being larger in length than each of the third bit lines, and
a plurality of fourth memory cell sets, each of the fourth memory cell sets including a plurality of memory cells and being connected to an associated one of the fourth bit lines, each of the fourth memory cell sets being larger in number of memory cells than each of the third memory cell sets.

13. The device as claimed in claim 11,
wherein the first end memory array further includes a plurality of first control lines each extending in the second direction, a selected one of the first control lines being activated to connect one of the memory cells included in each of the first memory cell sets to an associated one of the first bit lines;
wherein the first intermediate memory array further includes a plurality of second control lines each extending in the second direction, a selected one of the second control lines being activated to connect one of the memory cells included in each of the second memory cell sets to an associated one of the second bit lines; and
wherein at least one of the first control lines of the first end memory cell arrays is configured to be activated at least when one of the second control lines of the first intermediate memory array is activated.

14. The device as claimed in claim 12,
wherein the first end memory array further includes a plurality of first control lines each extending in the second direction, a selected one of the first control lines being activated to connect one of the memory cells included in each of the first memory cell sets to an associated one of the first bit lines;
wherein the first intermediate memory array further includes a plurality of second control lines each extending in the second direction, a selected one of the second control lines being activated to connect one of the memory cells included in each of the second memory cell sets to an associated one of the second bit lines;
wherein the second end memory array further includes a plurality of third control lines each extending in the second direction, a selected one of the third control lines being activated to connect one of the memory cells included in each of the third memory cell sets to an associated one of the third bit lines;
wherein the second intermediate memory array further includes a plurality of fourth control lines each extending in the second direction, a selected one of the fourth control lines being activated to connect one of the memory cells included in each of the fourth memory cell sets to an associated one of the fourth bit lines;
wherein at least one of the first control lines of the first end memory cell arrays is configured to be activated at least when one of the second control lines of the first intermediate memory array is activated; and
wherein at least one of the third control lines of the second end memory cell arrays is configured to be activated at least when one of the fourth control lines of the second intermediate memory array is activated.

15. The device as claimed in claim 11,
wherein the first end memory array further includes a plurality of first control lines each extending in the second direction, a selected one of the first control lines being activated to connect one of the memory cells included in each of the first memory cell sets to an associated one of the first bit lines;
wherein the first intermediate memory array further includes a plurality of second control lines each extending in the second direction, a selected one of the second control lines being activated to connect one of the memory cells included in each of the second memory cell sets to an associated one of the second bit lines; and
wherein at least two of the first control lines of the first end memory cell arrays are configured to be activated at least when one of the second control lines of the first intermediate memory array is activated.

16. The device as claimed in claim 12,
wherein the first end memory array further includes a plurality of first control lines each extending in the second direction, a selected one of the first control lines being activated to connect one of the memory cells included in each of the first memory cell sets to an associated one of the first bit lines;
wherein the first intermediate memory array further includes a plurality of second control lines each extending in the second direction, a selected one of the second control lines being activated to connect one of the memory cells included in each of the second memory cell sets to an associated one of the second bit lines;
wherein the second end memory array further includes a plurality of third control lines each extending in the second direction, a selected one of the third control lines being activated to connect one of the memory cells included in each of the third memory cell sets to an associated one of the third bit lines;
wherein the second intermediate memory array further includes a plurality of fourth control lines each extending in the second direction, a selected one of the fourth control lines being activated to connect one of the memory cells included in each of the fourth memory cell sets to an associated one of the fourth bit lines;
wherein at least two of the first control lines of the first end memory cell arrays are configured to be activated at least when one of the second control lines of the first intermediate memory array is activated; and
wherein at least two of the third control lines of the second end memory cell arrays are configured to be activated at least when one of the fourth control fines of the second intermediate memory array is activated.

* * * * *